United States Patent
Zhao et al.

(10) Patent No.: US 12,065,757 B2
(45) Date of Patent: Aug. 20, 2024

(54) MONOCRYSTAL GROWTH METHOD AND MONOCRYSTAL GROWTH DEVICE

(71) Applicants: SICHUAN JINKO SOLAR CO., LTD., Leshan (CN); JINKO SOLAR CO., LTD., Jiangxi (CN)

(72) Inventors: Lei Zhao, Leshan (CN); Xiaolong Bai, Leshan (CN)

(73) Assignees: SICHUAN JINKO SOLAR CO., LTD, Leshan (CN); JINKO SOLAR CO., LTD, Jiangxi (CN)

( * ) Notice: Subject to any disclaimer, the term of this patent is extended or adjusted under 35 U.S.C. 154(b) by 0 days.

(21) Appl. No.: 17/817,838

(22) Filed: Aug. 5, 2022

(65) Prior Publication Data

US 2023/0392284 A1    Dec. 7, 2023

(30) Foreign Application Priority Data

Jun. 1, 2022    (CN) .......................... 202210629430.4

(51) Int. Cl.
*C30B 29/06*    (2006.01)
*C30B 15/20*    (2006.01)
*C30B 15/36*    (2006.01)

(52) U.S. Cl.
CPC .............. *C30B 29/06* (2013.01); *C30B 15/20* (2013.01); *C30B 15/36* (2013.01)

(58) Field of Classification Search
CPC .......... C30B 29/06; C30B 15/20; C30B 15/36
See application file for complete search history.

(56) References Cited

U.S. PATENT DOCUMENTS 5,846,318 A  *  12/1998  Javidi ................ C30B 15/20
                                                          117/14
5,888,299 A  *   3/1999  Urano ................ C30B 15/26
                                                          117/14

(Continued)

FOREIGN PATENT DOCUMENTS

CN    101805925 A  *  8/2010  ............ C30B 15/00
CN    212582035 U  *  2/2021

(Continued)

OTHER PUBLICATIONS

Office Action is Japanese Application No. 2021018579 dated Sep. 27, 2022, pp. 1-4.

(Continued)

*Primary Examiner* — Hua Qi
(74) *Attorney, Agent, or Firm* — Pittsbury Winthrop Shaw Pittman, LLP; Chad Hammerlind

(57) ABSTRACT

A monocrystal growth method and device. The method includes loading silicon material into a crucible for melting to form molten silicon liquid; lowering a heat shield to a preset position, a first preset distance is formed between a lower edge of the heat shield and a liquid level of the molten silicon liquid; in a first stage, using a counterweight to hang a seed shaft to gradually descend in a first direction, using a camera apparatus to acquire a pixel image of the seed shaft and the lower edge of the heat shield for comparison to reference; then a second stage is entered, in which the image processing apparatus records a current position of the seed shaft, the seed shaft is continuously lowered until the seed shaft extends into the molten silicon liquid for welding; seeding; shouldering; body growth; and tailing.

10 Claims, 6 Drawing Sheets

(56) References Cited

U.S. PATENT DOCUMENTS

| | | | |
|---|---|---|---|
| 8,871,023 B2 | 10/2014 | Takanashi et al. | |
| 2016/0145764 A1* | 5/2016 | Takanashi | ............... C30B 15/26 117/15 |

FOREIGN PATENT DOCUMENTS

| | | | | |
|---|---|---|---|---|
| CN | 113403678 A | * | 9/2021 | |
| JP | 2005170773 A | | 6/2005 | |
| JP | 2016155729 A | | 9/2016 | |
| JP | 2017105654 A | | 6/2017 | |
| TW | 201823526 A | | 7/2018 | |
| WO | 2021/215057 A1 | | 10/2021 | |
| WO | 2022075061 A1 | | 4/2022 | |
| WO | WO-2022075061 A1 | * | 4/2022 | ............. C30B 15/26 |

OTHER PUBLICATIONS

European Application No. 22188528.8, Extended European Search Report dated May 25, 2023.

* cited by examiner

MONOCRYSTAL GROWTH METHOD AND MONOCRYSTAL GROWTH DEVICE

CROSS-REFERENCE TO RELATED APPLICATIONS

The present application claims priority to Chinese Application No. 202210629430.4, filed on Jun. 1, 2022, the content of which is incorporated herein by reference in its entirety.

TECHNICAL FIELD

The present disclosure relates to the technical field of monocrystalline silicon manufacture and, in particular, to a monocrystal growth method and a monocrystal growth device.

BACKGROUND

In the monocrystal growth process of the related art, when silicon added to a quartz crucible in a monocrystal furnace has melted, a silicon liquid level tends to be stable, which indicates that melting is completed. In this case, the crucible and the heat shield have been properly placed. Then, after the seed shaft is mounted, a preheat melting procedure begins. When a liquid level temperature in the quartz crucible reaches a welding temperature, the seed shaft is manually lowered for welding. However, the method of manually lowering the seed shaft is inefficient and not accurate.

SUMMARY

An objective of the present disclosure is to provide a monocrystal growth method and a monocrystal growth device, so as to solve the technical problem in the related art, which can accurately determine a position of a head of a seed shaft and a relative position of a liquid level, and provide a foundation for automation of a crystal growth process.

The present disclosure provides a monocrystal growth method, including: loading silicon material into a crucible for melting to form molten silicon liquid; lowering a heat shield to a preset position, a first preset distance is formed between a lower edge of the heat shield and a liquid level of the molten silicon liquid; in a first stage, using a counterweight to hang a seed shaft to gradually descend in a first direction, using a camera apparatus to acquire a pixel image of the seed shaft and the lower edge of the heat shield, and using an image processing apparatus to fit a reference circle according to the pixel image of the lower edge of the heat shield, the reference circle has a reference line extending along a second direction, a center of the reference circle falls on the reference line, and when the seed shaft descends, the pixel image of the seed shaft gradually approaches the reference line; when a bottom edge of the pixel image of the seed shaft intersects with the reference line, a bottom surface of the seed shaft is flush with the lower edge of the heat shield, then a second stage is entered, in which the image processing apparatus records a current position of the seed shaft, the seed shaft is continuously lowered by a fixed height, and a bottom end of the seed shaft extends into the molten silicon liquid for welding; performing seeding; performing shouldering; performing body growth; and tailing.

In one or more embodiments, in the first stage, the seed shaft gradually descends to a second preset distance from the liquid level of the molten silicon liquid, and when a liquid level temperature of the molten silicon liquid is heated to gradually approach a welding temperature, the seed shaft is lowered again to be flush with the lower edge of the heat shield, then the second stage is entered, when the liquid level temperature of the molten silicon liquid reaches the welding temperature, the seed shaft is lowered again by a fixed height, and the bottom of the seed shaft extends into the molten silicon liquid for welding.

In one or more embodiments, in the first stage, the seed shaft descends from an initial position to a third preset distance from the liquid level of the molten silicon liquid and maintains for a first time interval, then the seed shaft descends to a fourth preset distance from the liquid level of the molten silicon liquid and maintains for a second time interval, and finally the seed shaft descends to a second preset distance from the liquid level of the molten silicon liquid and maintains for a third time interval.

In one or more embodiments, the fixed height is equal to a sum of the first preset distance and a fine diameter length of the seed shaft.

In one or more embodiments, the first direction is perpendicular to the second direction.

In one or more embodiments, an axis direction of the seed shaft coincides with an axis direction of the heat shield.

In one or more embodiments, the first preset distance is in a range of 30 mm to 50 mm.

In one or more embodiments, the second preset distance is in a range of 350 mm to 450 mm.

The present disclosure further provides a monocrystal growth device, performing crystal growth by using the monocrystal growth method described above, the device including: a furnace body including a crucible and a heating component, the crucible is configured to hold molten silicon liquid, and the heating component is configured to heat the crucible; a heat shield arranged in the furnace body and located above the crucible; a counterweight hung inside the heat shield, a lower end of the counterweight is connected to a seed shaft movable along a first direction to be close to or away from a liquid level of the molten silicon liquid; a camera apparatus arranged above the heat shield and configured to acquire a pixel image of the seed shaft and a lower edge of the heat shield; and an image processing apparatus in signal connection with the camera apparatus, the image processing apparatus is configured to fit a reference circle according to the pixel image of the lower edge of the heat shield, the reference circle has a reference line extending along a second direction, a center of the reference circle falls on the reference line, and when a bottom edge of the pixel image of the seed shaft intersects with the reference line, a bottom surface of the seed shaft is flush with the lower edge of the heat shield According to the monocrystal growth device described above, in some embodiments, the camera apparatus is a CCD camera.

DESCRIPTION OF EMBODIMENTS

Figure 1:
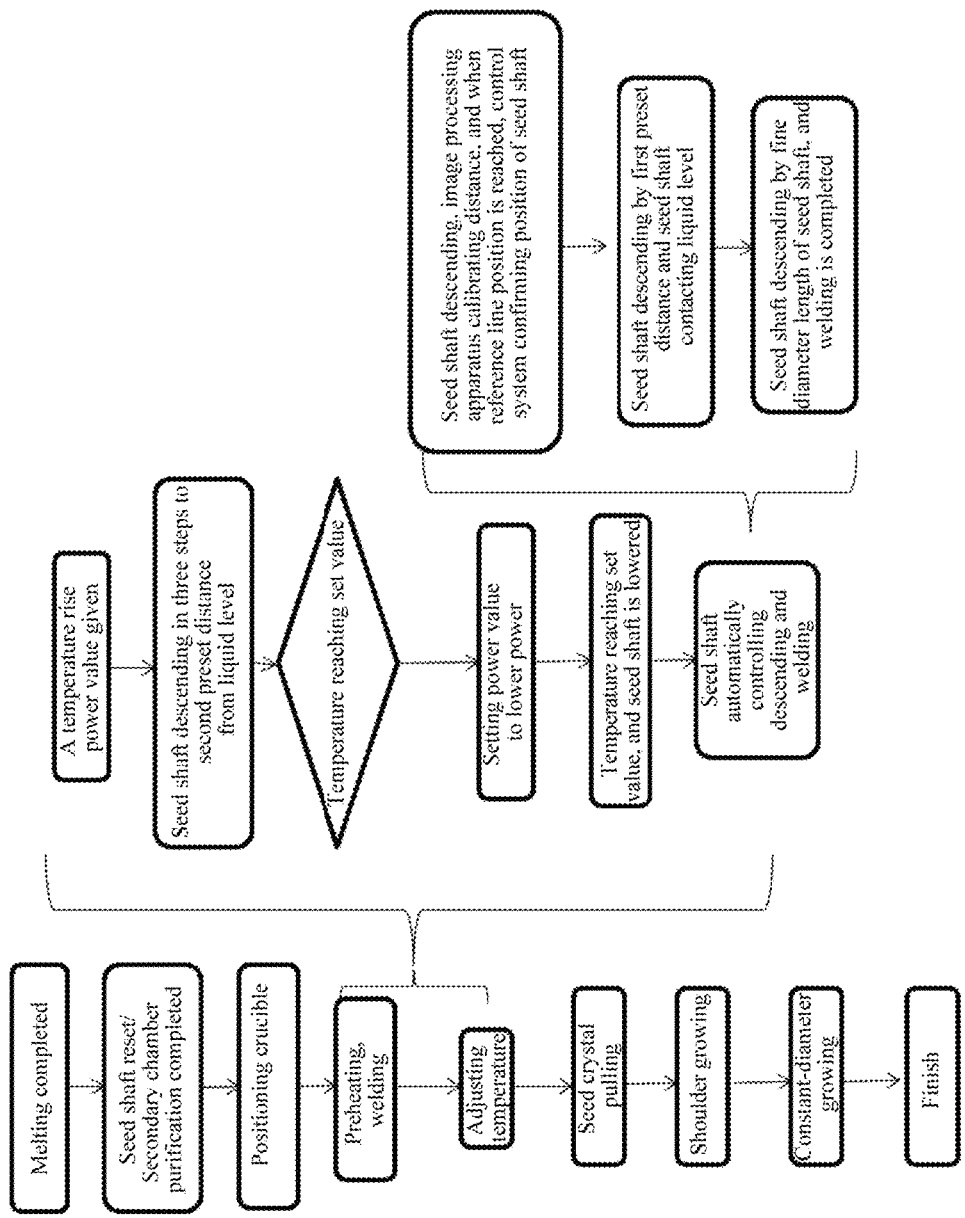
FIG. 1 is a flow block diagram of a monocrystal growth method according to an embodiment of the present disclosure.
Figure 2:
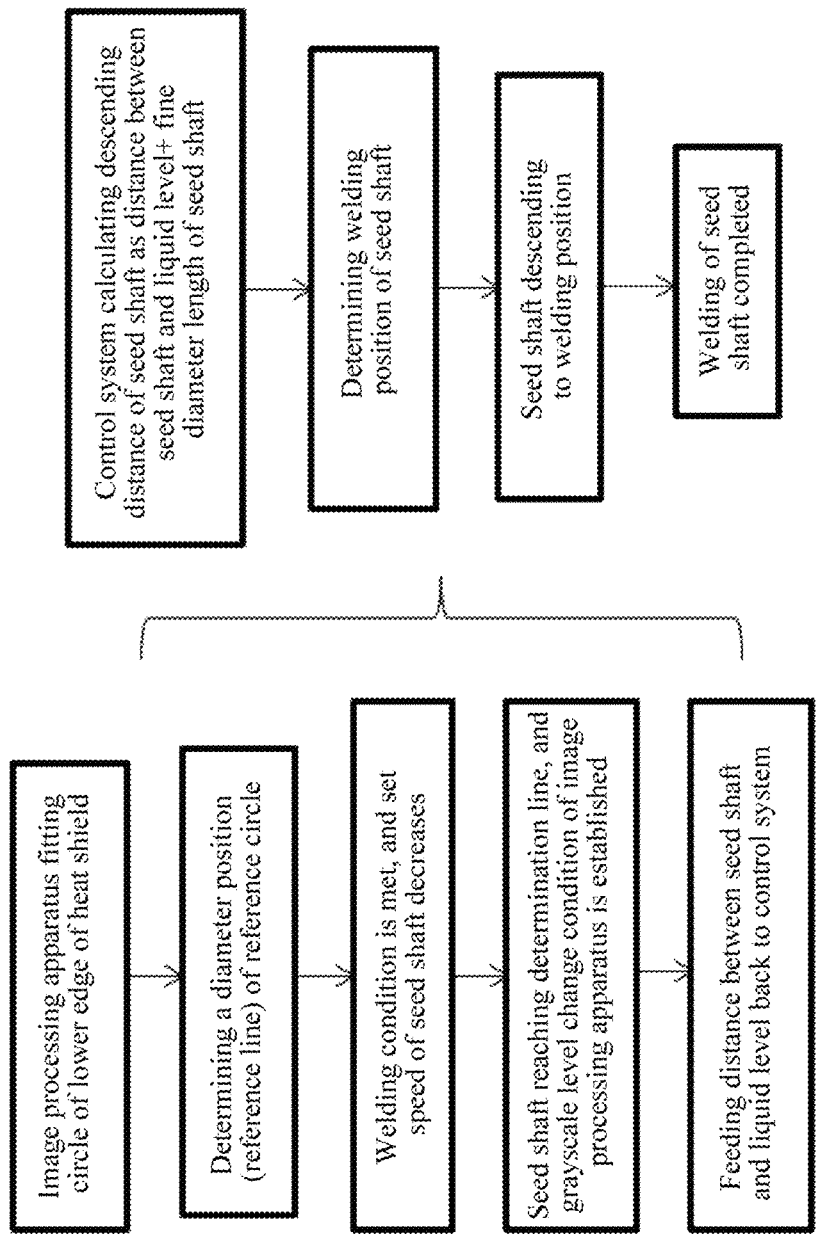
FIG. 2 is a flow block diagram of a seed shaft welding method according to Embodiment 1 of the present disclosure.

Embodiments described below with reference to the accompanying drawings are illustrative, and are intended only to explain the present invention and shall not to be interpreted as limitations to the present disclosure.

With the development of the semiconductor industry and photovoltaic industry, a greater market demand is put forward for monocrystalline silicon. At present, growth of monocrystalline silicon by a Czochralski method is the most widely used technology to manufacture monocrystalline silicon. In this method, a solid silicon ingot is loaded into a crucible 2 and heated to melt by a peripheral heater at a given power. Then, the power of the heater is reduced, and after a certain degree of supercooling is controlled, a directional seed shaft 7 is used to contact molten silicon liquid 4 for welding. By adjusting the temperature of the solution and growing speed of the seed shaft 7, the seed shaft 7 grows to a specified length. Then, operations such as seeding, shouldering, and body growth are performed, so that monocrystal is grown with a constant diameter. When the silicon liquid 4 is less in the crucible 2, a tailing operation is performed after the end of the body growth in order to improve the yield.

In the present disclosure, term "seeding" refers to an initial crystal growth procedure after a seed crystal is immersed into liquid silicon crystal, term "shouldering" refers to a process after seeding is performed to increase the diameter of the crystal rod, term "body growth" refers to a process in which the main portion of the crystal rod is formed (generally with substantially the same diameter), and term "tailing" refers to a process when the entire crystal growth is nearly accomplished. It is appreciated that, the above terms are illustrate but not limited as above.

In terms of a welding procedure, in an existing welding technology, welding is manually rather than automatically controlled. There is also a technical solution of determining a position of a seed crystal shaft to lower the seed shaft for welding. This solution requires real-time adjusting process parameters and may have a large error, which puts forward higher requirements for manufacturing management, and easily leads to welding accidents due to parameter setting errors.

In order to solve the above technical problems in the welding procedure, referring to FIG. 1 to FIG. 4 and FIG. 8, the present disclosure provides a monocrystal growth method, including the following steps.

Silicon is loaded into a crucible 2 for melting, and the melting is completed until a liquid level of molten silicon liquid 4 tends to be stable.

The molten silicon liquid 4 is provided with a heat shield 5 upstream of a gravity direction. The heat shield 5 may move back and forth along the gravity direction. Upon completion of the melting, the heat shield 5 is lowered to a preset position. In this case, a first preset distance L1 is formed between a lower edge 51 of the heat shield 5 and the liquid level of the molten silicon liquid 4.

The preset position is a calibrated position. At the preset position, the lower edge 51 of the heat shield 5 is maintained at a calibrated first preset distance L1 from the liquid level of the molten silicon liquid 4. The first preset distance L1 serves as a reference value. When the seed shaft 7 reaches a same horizontal plane as the lower edge 51 of the heat shield 5, it means that a distance between a bottom end 71 of the seed shaft 7 and the liquid level of the silicon liquid 4 is the first preset distance L1, and an initial position of the seed shaft 7 can be accurately positioned. This provides a positioning foundation for subsequent automatic descent of the seed shaft 7 for welding, and thus can prevent abnormal welding caused by excessively much or excessively little descent of the seed shaft 7.

In a first stage, a counterweight 6 is used to hang the seed shaft 7 down gradually in a first direction D1. In embodiments of the present disclosure, the first direction D1 is set to the gravity direction. The other end of the counterweight 6 is connected to an automatic lifting apparatus. The automatic lifting apparatus is configured to drive the seed shaft 7 to move up and down.

A camera apparatus 8 is arranged upstream of a gravity direction of the heat shield 5. The camera apparatus 8 is in communication connection with the image processing apparatus. The camera apparatus 8 is used to acquire pixel images of the seed shaft 7 and the lower edge 51 of the heat shield 5. A preset angle is formed between a shooting direction of the camera apparatus 8 and the first direction D1. In this way, the pixel image of the lower edge 51 of the heat shield 5 is not a standard circle, but a quasi-ellipse. Moreover, different fixed points of the camera apparatus 8 lead to different shooting directions, resulting in different ellipse-like structures formed by collected pixel images. In order to eliminate the difference between the pixel images caused by different fixed points of the camera apparatus 8, the image processing apparatus is used to fit a reference circle 9 according to the pixel image of the lower edge 51 of the heat shield 5. The reference circle 9 is a standard circle. The reference circle 9 has a reference line 10 extending along a second direction D2. In embodiments of the present disclosure, the first direction D1 is perpendicular to the second direction D2, the second direction D2 is set as a direction perpendicular to the seed shaft 7, and a center of the reference circle 9 falls on the reference line 10. When the seed shaft 7 descends, a pixel image of the seed shaft 7 gradually approaches the reference line 10.

When a bottom edge of the pixel image of the seed shaft 7 intersects the reference line 10, it indicates that a bottom surface of the seed shaft 7 is flush with the lower edge 51 of the heat shield 5. In this case, a second stage is entered where the image processing apparatus records the current position of the seed shaft 7, and then sends an instruction signal to the automatic lifting apparatus. The automatic lifting apparatus is used to continuously lower the seed shaft 7 by a fixed height. The fixed height is a custom height. Since the initial position of the seed shaft 7 has been determined, only parameters of the fixed height are required to be determined in advance, without the need to constantly adjust process parameters. The bottom end 71 of the seed shaft 7 descends by a fixed height and extends into the molten silicon liquid 4 for welding, and then seeding, shouldering, body growth, and tailing operations are sequentially performed.

In the above embodiments, the position of the lower edge 51 of the heat shield 5 is used as calibration, and the position of the seed shaft 7 is positioned by the camera apparatus 8 and the image processing apparatus, so that the bottom end 71 of the seed shaft 7 is flush with the lower edge of the heat shield 5, and then the seed shaft 7 is lowered by a fixed height, which realizes accurate descent and welding of the seed shaft 7 and prevents abnormal welding caused by large deviation of the position of the seed shaft 7.

In embodiments according to the present disclosure, in the first stage, the seed shaft 7 gradually descends to a second preset distance from the liquid level of the molten silicon liquid 4. The gradual descent of the seed shaft 7 is intended to allow the seed shaft 7 to be gradually and fully preheated and prevent formation of crystal defects caused by quick temperature rise of the seed shaft 7. When the liquid level temperature of the molten silicon liquid 4 is heated to gradually approach a welding temperature, the heat shield 5 is at a preset position, and the seed shaft 7 is lowered again to be flush with the lower edge 51 of the heat shield 5. In this case, the bottom of the seed shaft 7 is at a first preset distance L1 from the surface of the liquid level of the molten silicon liquid 4, so that a definite initial position of the seed shaft 7 can be defined to facilitate the subsequent descent of the seed shaft 7, which prevents an unstable welding procedure caused by excessively much or excessively little descent of the seed shaft 7. In this case, the second stage is entered. When the liquid level temperature of the molten silicon liquid 4 reaches a welding temperature condition, the seed shaft 7 is lowered again by a fixed height, and the bottom of the seed shaft 7 extends into the molten silicon liquid 4 for welding.

In embodiments according to the present disclosure, in the first stage, the seed shaft 7 descends from an initial position to a third preset distance from the liquid level of the molten silicon liquid 4 and maintains for a first time interval, then the seed shaft 7 descends to a fourth preset distance from the liquid level of the molten silicon liquid and maintains for a second time interval, and finally the seed shaft 7 descends to a second preset distance from the liquid level of the molten silicon liquid 4 and maintains for a third time interval. The seed shaft 7 descends in three steps to the second preset distance above the liquid level to prevent crystal defects caused by quick temperature rise of the seed shaft 7. In some embodiments, in this process, the seed shaft 7 first descends from the initial position to a position 1300 mm to 1700 mm away from the liquid level of the molten silicon liquid 4 for 5 min to 10 min, descends again to 500 mm to 900 mm for 5 min to 10 min, and then descends again to 350 mm to 450 mm for 10 min to 15 min. Those skilled in the art can understand that the process position and time can be adjusted in a control system. As a result, the seed shaft 7 is gradually preheated and meets time requirements of preparations before temperature adjustment. In some embodiments, the seed shaft 7 first descends from the initial position to a position 1500 mm away from the liquid level of the molten silicon liquid 4 for 10 min, descends again to 700 mm for 5 min, and then descends again to 400 mm for 10 min, so that the seed shaft 7 is gradually and fully preheated, preventing formation of crystal defects caused by quick temperature rise of the seed shaft 7.

In embodiments according to the present disclosure, the fixed height is equal to a sum of the first preset distance and a length of the fine diameter portion of the seed shaft 7. The length of the fine diameter portion is a length of the seed shaft 7 extending into the molten silicon liquid 4. In some embodiments, the length of the fine diameter portion is in a range of 130 mm to 140 mm. For example, the length of the fine diameter portion may be 130 mm, 132 mm, 134 mm, 136 mm, 138 mm, or 140 mm. The length of the fine diameter portion of the seed shaft 7 may be unified in manufacturing management and set in parameters. Since the position of the heat shield 5 has been determined, the first preset distance may be a constant value, and the fine diameter length of the seed shaft 7 is also a constant value, so that the fixed length is also a fixed parameter, which prevents frequent adjustment of process parameters in the control system and reduce the occurrence of welding accidents caused by parameter setting error.

In embodiments according to the present disclosure, an axis direction of the seed shaft 7 coincides with that of the heat shield 5. The seed shaft 7 is aligned with the heat shield 5. In the pixel images of the seed shaft 7 and the heat shield 5, the pixel image of the seed shaft 7 is a strip structure extending along the gravity direction, and an extension direction of the seed shaft 7 passes through the center of the reference circle 9, so that a center region of the reference line 10 is located can be defined as a test region. When a grayscale value of the reference line 10 changes in the test region, it indicates that the seed shaft 7 has descended into contact with the reference line 10, so it can be determined that the seed shaft 7 has descended to the level of the heat shield 5.

In embodiments according to the present disclosure, the first preset distance D1 is in a range of 30 mm to 50 mm, including endpoint values. For example, the first preset distance D1 may be 30 mm, 35 mm, 40 mm, 45 mm, or 50 mm. As some embodiments, when the heat shield 5 reaches the lowest point, it also reaches the preset position, so there is no need to position the heat shield 5, preventing the technical problem of welding defects caused by parameter setting of the heat shield 5. In some embodiments, the first preset distance D1 is 30 mm. Those skilled in the art can understand that the value of the first present distance may be adjusted in the control system and set in parameters.

In embodiments according to the present disclosure, the second preset distance is in a range of 350 mm to 450 mm, including endpoint values. For example, the second preset distance may be 350 mm, 375 mm, 400 mm, 425 mm, or 450 mm. The second preset distance cannot be excessively large or excessively small, an excessively large distance leads to insufficient preheating, and an excessively small distance leads to excessive preheating, both of which may lead to the formation of crystal defects. In some embodiments, the second preset distance is 400 mm. Those skilled in the art can understand that the value of the second present distance may be adjusted in the control system and set in parameters.

The solution is described below through a specific embodiment.

In step S10, solid polysilicon is loaded into the crucible 2, the solid polysilicon is heated at a high temperature in the crucible 2, and the solid polysilicon gradually melts. When the solid polysilicon melts into liquid molten silicon liquid 4, the liquid level of the molten silicon liquid 4 tends to be stable, and the melting is completed.

In step S20, upon completion of the melting, the seed shaft 7 is mounted to a seed chuck. Through a seed reset/ secondary chamber purification procedure, the seed shaft 7 is connected to a primary chamber of a monocrystal path in a secondary chamber of a monocrystal furnace, and is evacuated and purified by argon gas through the secondary chamber. When pressure of the secondary chamber is consistent with the main chamber, an isolation valve of the primary chamber and the secondary chamber is switched on.

In step S30, a crucible is positioned. The crucible 2 is placed at a position required by the process. Upon completion, a preheat melting procedure begins. The seed shaft 7 descends to a position 1500 mm away from the liquid level for 5 min, then descends again to 700 mm for 5 min, and descends again to 400 mm for 10 min.

In step S40, when the liquid level temperature of the molten silicon liquid 4 gradually approaches the melting temperature under power adjustment of the preheat melting procedure, the seed shaft 7 is lowered again. In this case, a camera apparatus 8 is used to acquire pixel images of the seed shaft 7 and a lower edge 51 of the heat shield 5. An image processing apparatus is used to fit a reference circle 9 according to the pixel image of the lower edge 51 of the heat shield 5. The reference circle 9 has a reference line 10 extending along a second direction D2. When the seed shaft 7 descends such that a bottom edge of the pixel image of the seed shaft 7 intersects the reference line 10. That is, a bottom surface of the seed shaft 7 is flush with the lower edge 51 of the heat shield 5, the seed shaft 7 stops descending. In this case, the seed shaft 7 is 30 mm above the liquid level of the molten silicon liquid 4.

In step S50, the control system automatically adjusts heating power to adjust the liquid level temperature of the molten silicon liquid 4. After the liquid level temperature of the molten silicon liquid 4 reaches the welding temperature, the control system triggers descent of the position of the seed shaft 7 for welding. A temperature adjustment procedure is entered upon completion of the welding.

In step S60, when the liquid level temperature of the molten silicon liquid 4 reaches a target temperature required by the process and maintains the temperature for 15 min, it is determined that a seeding procedure can be entered. After seeding begins, silicon monocrystal begins to grow from liquid to solid along a crystal atom sequence of the seed shaft 7. It is required in the seeding that a crystal diameter reaches 6 mm and a length required by the process is reached, so as to eliminate dislocation in the crystal.

In step S70, when the crystal length for the seeding process is as required, the system enters a shouldering procedure. The crystal diameter gradually increases during shouldering, until the diameter required by the process is reached.

In step S80, the pulling process is finished.

Figure 5:
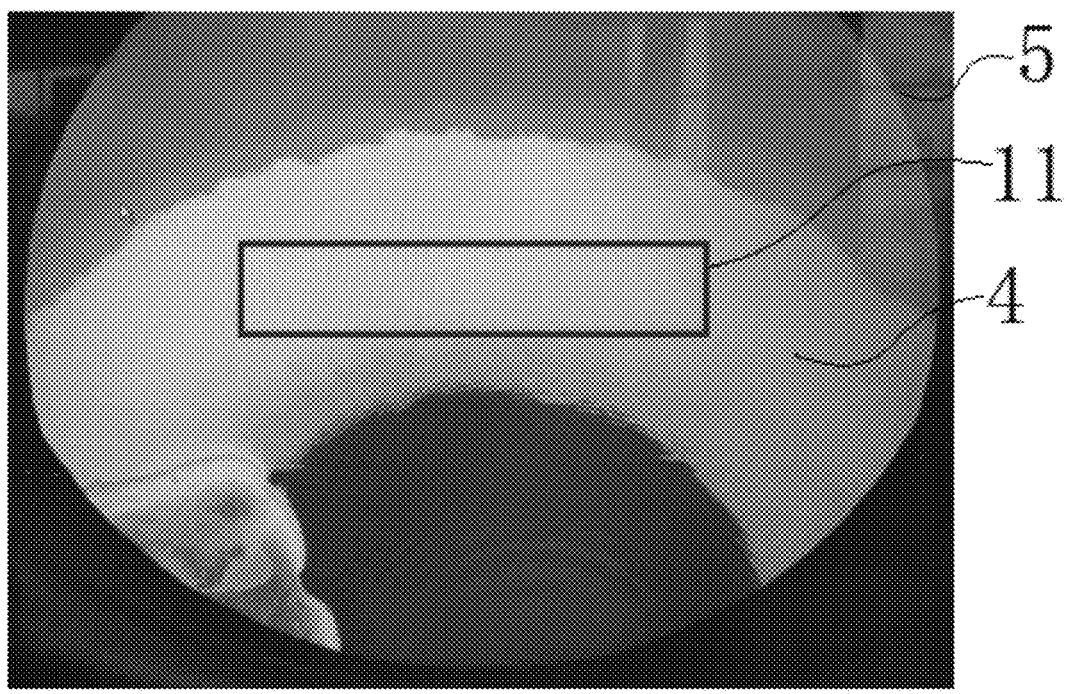
FIG. 5 is a schematic diagram of a picture taken by a camera apparatus according to Embodiment 2 of the present disclosure.
Figure 8:
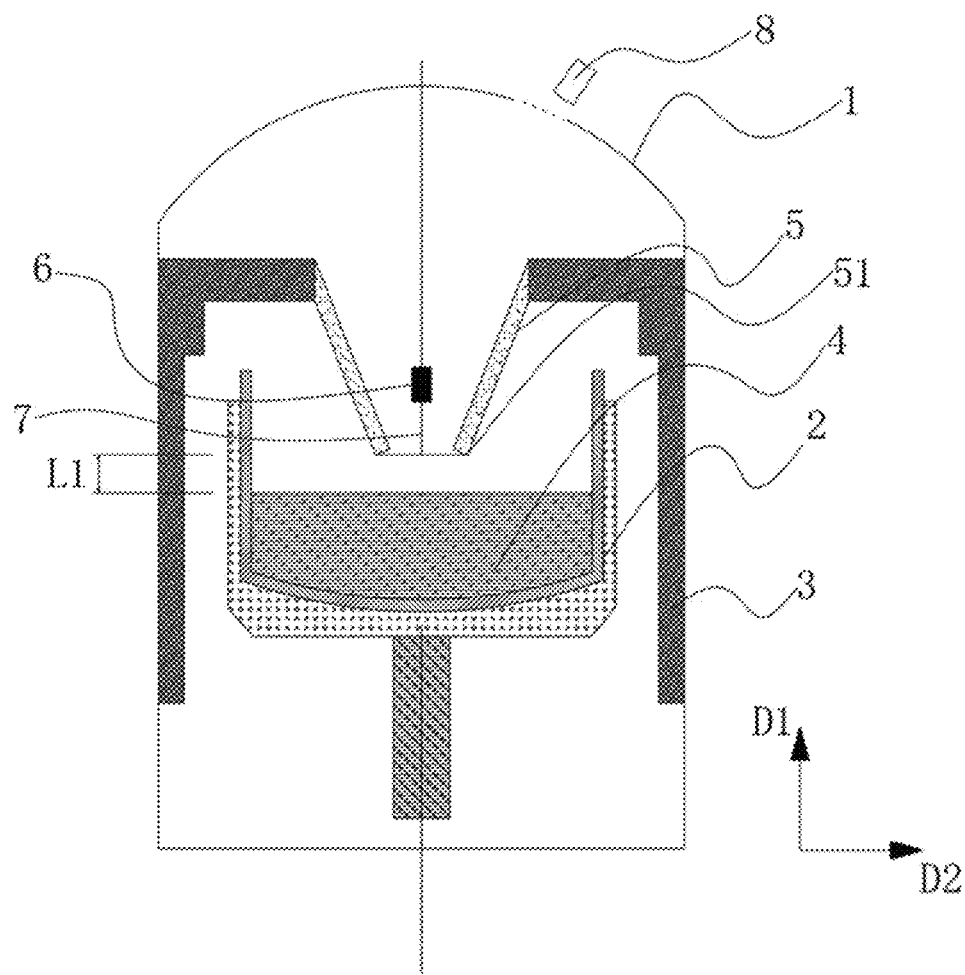
FIG. 8 is a schematic structural diagram of a monocrystal growth device according to the present disclosure.
Figure 9:
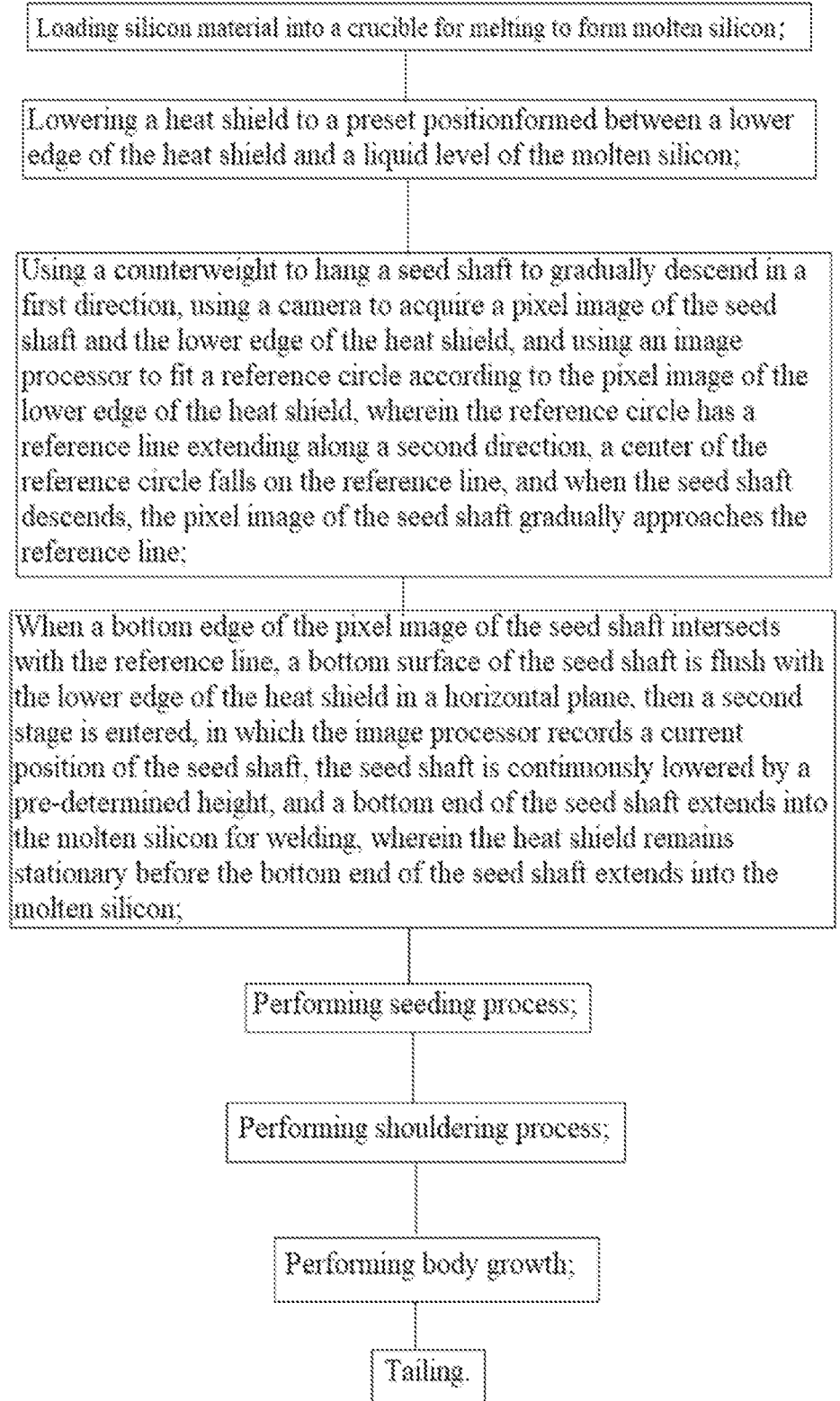
FIG. 9 is a flowchart of a method of monocrystal growth according to the present disclosure.

In some embodiments of the present disclosure, in the melting procedure, full melting detection is required to judge whether the silicon is completely melted into the liquid molten silicon liquid 4. Referring to FIG. 5 and FIG. 8, the camera apparatus 8 and the image processing apparatus are used to perform full melting detection on the silicon in the crucible 2.

In the monocrystal growth process, polysilicon is added to the monocrystal furnace. After the furnace is closed, the heater is turned on to produce a high temperature. At the same time, Ar gas is passed into a furnace body 1 as protective gas to isolate oxygen. A dry pump is used to pump the whole furnace body 1 to a certain vacuum degree, to ensure that volatiles generated by the high temperature are continuously discharged from the furnace body 1. In this case, solid polysilicon begins to melt due to the high temperature in the furnace body 1. When the silicon melts to some extent, a charging cylinder may be used for charging, and the feeding stops until silicon required by the manufacturing is added to the crucible 2. In this case, the power of the heater is continuously supplied, until the silicon has completely molten. The solid polysilicon wholly melts into the liquid molten silicon liquid 4.

In this process, the camera apparatus 8 and the image processing apparatus are used to observe changes in the silicon liquid level in the thermal field and control system parameter setting to determine whether the melting is completed. The pixel image of the lower edge 51 of the heat shield 5 is acquired through the camera apparatus 8. Several different regions exist in an ellipse-like pixel image formed by the lower edge 51 of the heat shield 5. The first region is a part that has melted into molten silicon liquid 4, and the second region is a part of a polysilicon ingot that has not melted. Grayscale values of the first region and the second region are obviously different. The image processing apparatus defines a first measurement block 11 at a fixed position in the pixel image. The first measurement block 11 is used to determine a data sampling range. A general definition range of height*width is 900±100 mm*250±50 mm (this value is set according to pixel coordinates of CCD resolution; under higher CCD resolution, measurement coordinate points are required to be adjusted according to an actual situation in a case that pixels increase and the measurement range remains unchanged). For example, the range value may be 800 mm*200 mm, 820 mm*210 mm, 840 mm*220 mm, 860 mm*230 mm, 880 mm*240 mm, 900 mm*250 mm, 920 mm*260 mm, 940 mm*270 mm, 960 mm*280 mm, 980 mm*290 mm, or 1000 mm*300 mm. A central coordinate is set at a position where the molten silicon liquid 4 is not affected by reflection of the heat shield 5 to determine the data sampling range. When a solid silicon ingot has almost completed the melting, the last silicon ingot floats on the surface of the silicon liquid level. In this case, the crucible 2 rotates at a low speed, and the protective gas Ar flows down from an upper part of the furnace body 1 to a lower part of the furnace body 1. Therefore, the solid silicon ingot floats and moves back and forth on the surface of the molten silicon liquid 4, which may cause a continuous and disorderly change in the grayscale value in the first measurement block 11. When the silicon liquid level becomes stable, an average grayscale of the image in the first measurement block 11 does not change for a certain period of time. In this case, the average grayscale value is generally within 50±5 pixels, and a time parameter may be set to 15 min, 10 min, 12 min, 17 min or 20 min. The grayscale value is in the range of 50±5 pixels within the time range. As a result, it can be determined that the melting is complete. The determination may be based on vision software in the image processing apparatus to calculate changes in the grayscale value in the first measurement block 11 combined with boundary condition parameters set in the control system, such as a minimum difference of changes in the grayscale value. The time is determined and transfers to the preheat melting procedure time after the determination condition is met.

Figure 6:
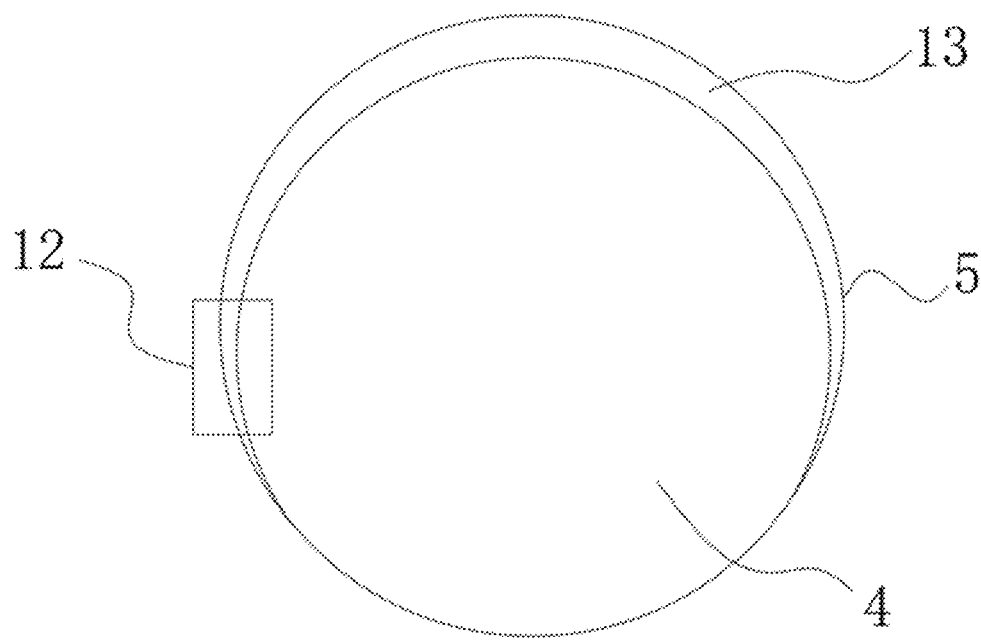
FIG. 6 is a schematic diagram of a picture taken by a camera apparatus according to Embodiment 3 of the present disclosure.

In some embodiments of the present disclosure, in the preheat melting procedure, referring to FIG. 6 and FIG. 8, the camera apparatus 8 and the image processing apparatus are used to complete a scheme of measuring a liquid-to-opening distance of the heat shield 5.

When melting of the silicon is completed, the liquid level of the molten silicon liquid 4 tends to be stable. In this case, the heat shield 5 is lowered to the lowest point, that is, the preset position. At the same time, the position of the crucible is raised, and the lower edge 51 of the heat shield 5 is a certain distance from the silicon liquid level, which is referred to as the liquid-to-opening distance.

The pixel image of the lower edge 51 of the heat shield 5 is acquired through the camera apparatus 8. In an ellipse-like pixel image formed by the lower edge 51 of the heat shield 5, a boundary of the lower edge 51 of the heat shield 5 has a reflection on the silicon liquid level. A crescent-shaped image 13 is formed between the reflection and an ellipse-like boundary. The image processing apparatus defines a second measurement block 12 in the pixel image to determine a data sampling range. The range may be set on software. A range of height*width of the second measurement block 12 is generally set to 140±10 mm*90±10 mm (this value is set according to pixel coordinates of the CCD resolution). A capture grayscale difference threshold is set in a range of 5 to 25 pixels, which may be, for example, 10 pixels, 15 pixels, or 20 pixels. According to the set range and the boundary condition, the vision software can capture two adjacent arcs of a crescent-shaped boundary, and calculate tangents of a fitting circle of the arcs. A vertical distance between the two tangents is a measured value of the liquid-to-opening distance.

In practice, the measured value may be calibrated according to a manual or automatic calibration method. During the calibration, the system may determine a linear relationship between an actual distance and a measured distance according to a lifting distance of a crucible lift motor, so as to obtain the measured value of the liquid-to-opening distance to calibrate the actual value of the liquid-to-opening distance.

The automatic calibration method involves lowering and then raising a crucible position with a constant value, which is generally 8 mm to 15 mm (the lowered distance is a mechanical distance of the crucible position, which may be converted from a motor speed) to determine a change (e.g., 10 mm, 12 mm, or 14 mm) in the distance, so as to obtain a fitting formula and determine the liquid-to-opening distance upon completion of the calibration.

Figure 7:
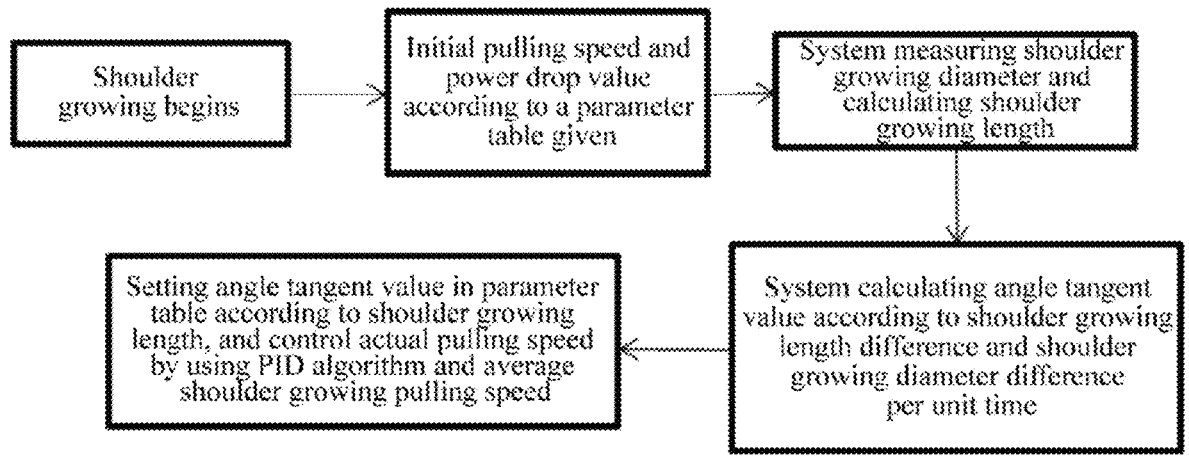
FIG. 7 is a flow block diagram of a shouldering control scheme according to Embodiment 3 of the present disclosure.

In some embodiments of the present disclosure, in the shouldering procedure, a shoulder shape of shouldering is required to be automatically controlled. Referring to FIG. 7 and FIG. 8, this embodiment is mainly about algorithm logic of the process of shouldering. The crystal undergoes seeding process to shouldering and then to body growth in the crystal growth process, and the shouldering process is a process in which the crystal diameter gradually enlarges from small to large during monocrystal growth. In embodiments according to the present disclosure, this process is a process in which a monocrystal furnace device controls a shouldering speed and shouldering power through the control system so as to control the shape of the shoulder to realize shouldering. A set of basic parameters may be set and control parameters of a PID algorithm may be given in the control system.

For example, a shouldering automatic control step includes the following steps.

In step one, shouldering begins.

In step two, an initial growing speed and a power drop value are determined according to a parameter table.

In step three, the control system measures a shouldering diameter and calculates a shouldering length.

In step four, the control system calculates an angle tangent value according to a shouldering length difference and a shouldering diameter difference per unit time.

In step five, the angle tangent value is set in the parameter table according to the shouldering length, and an actual growing speed is controlled using a PID algorithm and an average shouldering speed.

For example, an average growing speed of monocrystal is 300 mm/h in a seeding process. When a seeding length reaches a certain length, enters into a shouldering stage, in which an initial growing speed set to 60 mm/h is determined. At the growing speed, the shouldering length of the crystal gradually increases, and the given power gradually decreases in the parameter table of the control system. In this case, as the crystal length increases (defined as a Y direction), the crystal diameter begins to increase (defined as an X direction). In the X direction of diameter increase, a crystal growth system can calculate a diameter change rate and can calculate an average increase rate over a certain period of time (X direction). In this case, a rising speed of the crystal in the Y direction is the crystal growth speed, and this parameter system can calculate an average growing speed in a certain period of time.

In order to facilitate stable control, in embodiments of the present disclosure, an average diameter increase rate of 10 min and an average growing speed of 10 min are used for calculation and control. A tangent function of a shouldering angle may be expressed as Tan A=$V_{average\ diameter\ rate}$ (mm/min)/$V_{average\ growing\ speed}$ (mm/min). Angle values are set for different shouldering lengths during the shouldering. Corresponding values of the angles may be represented by a tangent function, namely, Tan A. In order to control the shoulder shape of shouldering, theoretically, an optimal shoulder shape may be divided into three stages according to shouldering heights, i.e., initial stage, middle stage, and later stage. Tan A=0.48-0.1 may be set in the initial stage of shouldering, Tan A=0.9-1.9 in the middle stage of shouldering, and Tan A=1.8-2.3 in the later stage of shouldering. A parameter table of Tan A can be given according to the shouldering lengths. In order to control stability and easy control over a PLC system, an actually controlled parameter Tan A' value is set as a value of $V_{average\ diameter\ rate\ of\ 10\ min}/V_{average\ growing\ speed\ of\ 10\ min}$. The value can be calculated after the shouldering starts. The system can set that the control is started after 1 min to 5 min. Therefore, a difference value is obtained from a Tan A'−Tan A table, and PLC control can be performed with a PID control model according to the difference value (for example, Formula 1 is a PID calculation formula), where At is a set growing speed, and $A_0$ is an actual average growing speed. P, I, D can be controlled according to a given value of the shouldering length.

$$A_t = A_0 + \delta B * P + \int_0^t \delta B * I + \frac{\delta B}{\delta t} * D \qquad \text{(Formula 1)}$$

In addition, during crystal growth, a volume of monocrystal pulled out per unit time is proportional to the value of reduced power. During system parameter setting, a certain power reduction can be set to meet the requirement of the shouldering process.

The shouldering process is to set a growing speed to control crystal growth in the shouldering process. In the formula, δB=Tan A'−Tan A, as shown in Table 1. Tan A=0.6704 when a standard shouldering parameter is adopted for 20 min. In this case, it is actually calculated that Tan A'=0.7 (assumed), and δB=0.0296. When the value of δB/δt is collected at the same time, it may be set to an actual value of δB for 10 s. Assuming that the value is 0.01 and a program is set to calculate $\int_0^t \delta B$, the value may be set to T=30 min and accumulated every 10 s. the calculated value is assumed to be 0.05. In an actual control test, the effect of integral can be reduced during the shouldering, and the influence of the integral part on the control over the growing speed can be reduced. Therefore, the set value of I can be reduced according to the calculation result.

Assuming that $A_0$=90 mm/h, the growing speed is set to At=90+0.0296*P+0.05*I+0.01*D. In an actual test, P, I, D values are set according to an actual control situation of shouldering so as to realize the control over the shouldering process.

The camera apparatus 8 is arranged above the heat shield 5. The camera apparatus 8 is configured to acquire pixel images of the seed shaft 7 and a lower edge 51 of the heat shield 5. In some embodiments, the camera apparatus 8 is a CCD camera.

The image processing apparatus is in signal connection with the camera apparatus 8. The image processing appa-

TABLE 1

| Shouldering time node min | Length mm | Average growing speed of 10 min mm/h | Average growing speed of 10 min mm/min | Average diameter rate of 10 min mm/min | TanA (set parameter) | Remarks |
|---|---|---|---|---|---|---|
| 10 | 13 | 71.84 | 1.197 | 0.58 | 0.4844 | According to the PID |
| 20 | 23 | 60.14 | 1.002 | 0.672 | 0.6704 | control model, the actual |
| 30 | 33 | 56.82 | 0.947 | 0.814 | 0.8596 | TanA is higher than the |
| 40 | 42.8 | 61.99 | 1.033 | 1.182 | 1.1441 | lifting speed of the |
| 50 | 53 | 58.55 | 0.976 | 1.384 | 1.4183 | parameter on the left |
| 60 | 64 | 67.9 | 1.132 | 1.836 | 1.6224 | and lower than the |
| 70 | 75 | 70.57 | 1.176 | 1.814 | 1.5423 | descending speed of the |
| 80 | 88.2 | 74.95 | 1.249 | 2.257 | 1.8068 | parameter on the left. |
| 90 | 102 | 86.28 | 1.438 | 3.308 | 2.3004 | This parameter can be |
| 100 | 116 | 89.23 | 1.487 | 3.188 | 2.1437 | adjusted according to |
| 110 | 130 | 77.85 | 1.298 | 2.561 | 1.9738 | the shape of the shoulder. |
| 120 | 143 | 80.72 | 1.345 | 3.137 | 2.3318 | It is recommended that the average growing speed of shouldering can be calculated as the average value of 10 min or 15 min. |

Figure 3:
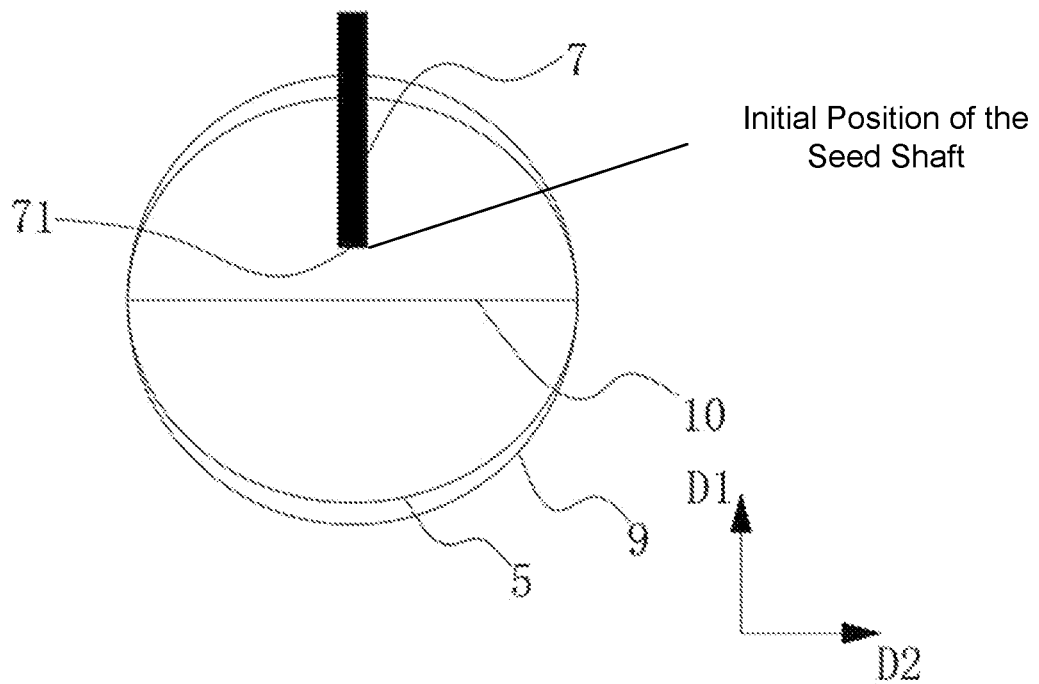
FIG. 3 is a first schematic diagram of pixel images of a seed shaft and a lower edge of a heat shield according to Embodiment 1 of the present disclosure.
Figure 4:
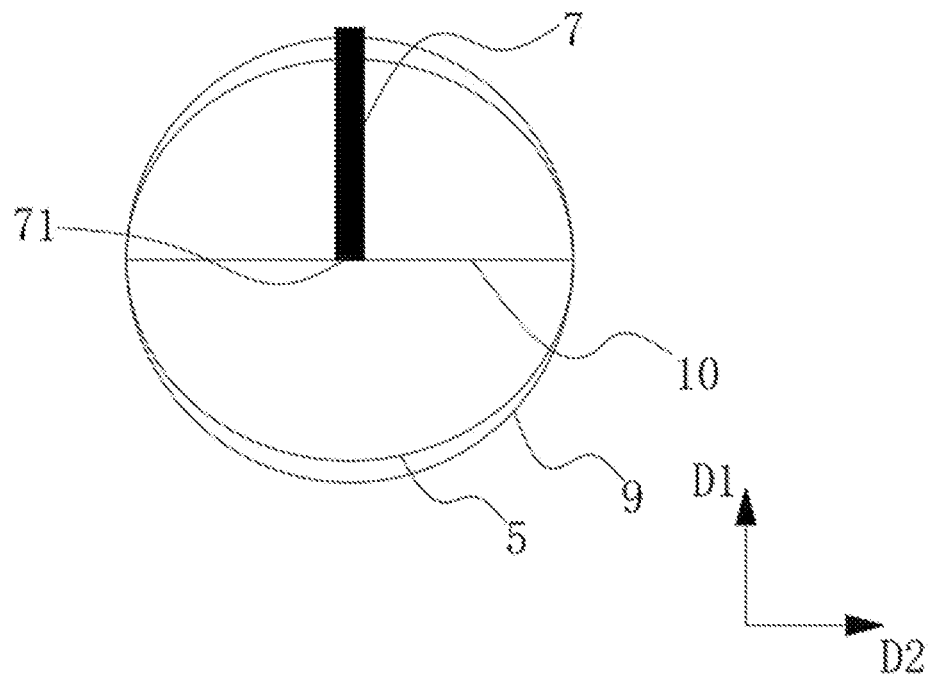
FIG. 4 is a second schematic diagram of the pixel images of the seed shaft and the lower edge of the heat shield according to Embodiment 1 of the present disclosure.

Based on the above embodiments, the present disclosure further provides a monocrystal growth device, for performing crystal growth by using the monocrystal growth method described above. Referring to FIG. 3, FIG. 4, and FIG. 8, the device includes a furnace body 1, a heat shield 5, a counterweight 6, a camera apparatus 8, and an image processing apparatus.

The furnace body 1 is provided with a crucible 2 and a heating component 3. The crucible 2 is configured to hold molten silicon liquid 4. The heating component 3 is configured to heat the crucible 2. In some embodiments, the crucible 2 includes a quartz crucible and a CC crucible. The quartz crucible is configured to hold silicon, such as polysilicon. The silicon is heated to a silicon melt, and the CC crucible wraps the outside of the quartz crucible to provide support for the quartz crucible during heating. A heater is arranged on an outer side of the graphite crucible. The bottom of the crucible 2 is provided with a supporting rod. The supporting rod is configured to support the crucible 2 and the silicon, and can give the crucible 2 rotation or lifting power.

The heat shield 5 is arranged in the furnace body 1. The heat shield 5 is located above the crucible 2. The heat shield 5 has an inverted conical screen that extends down around a growth region of silicon monocrystal, which can block direct heat radiation from the heater and the high-temperature molten silicon liquid 4 to a growing silicon monocrystal rod, and reduce a temperature of the silicon monocrystal rod. In addition, the heat shield can also concentrate and directly spray downblown protective gas near a growth interface, further enhancing the heat dissipation of the silicon monocrystal rod.

The counterweight 6 is hung inside the heat shield 5 by a drawstring. A lower end of the counterweight 6 is connected to a seed shaft 7. The seed shaft 7 is movable along a first direction D1 to be close to or away from a liquid level of the molten silicon liquid 4. In a monocrystal growth process, the seed shaft 7 grows into a silicon monocrystal rod through processes such as melting, seeding, shouldering, shoulder rotation, and body growth.

ratus may fit a reference circle 9 according to the pixel image of the lower edge 51 of the heat shield 5. The reference circle 9 has a reference line 10 extending along a second direction D2. A center of the reference circle 9 falls on the reference line 10. When a bottom edge of the pixel image of the seed shaft 7 intersects the reference line 10, a bottom surface of the seed shaft 7 is flush with the lower edge 51 of the heat shield 5.

The structure, features and effects of the present disclosure are described in detail above according to the embodiments shown in the drawings. The above are only preferred embodiments of the present disclosure, but the present disclosure does not limit the scope of implementation as illustrated in the drawings. Any changes made in accordance with the conception of the present disclosure, or equivalent embodiments modified as equivalent changes shall fall within the protection scope of the present disclosure.

What is claimed is:

1. A monocrystal growth method, comprising:
   loading silicon material into a crucible for melting to form molten silicon;
   lowering a heat shield to a preset position, wherein a first preset distance is formed between a lower edge of the heat shield and a liquid level of the molten silicon, the position of the lower edge of the heat shield is used as calibration, wherein the first preset distance is in a range of 30 mm to 50 mm;
   in a first stage, using a counterweight to hang a seed shaft to gradually descend in a first direction, using a camera to acquire a pixel image of the seed shaft and the lower edge of the heat shield, and using an image processing apparatus to fit a reference circle according to the pixel image of the lower edge of the heat shield, wherein the reference circle has a reference line extending along a second direction, a center of the reference circle falls on the reference line, and when the seed shaft descends, the pixel image of the seed shaft gradually approaches the reference line;

wherein when a bottom edge of the pixel image of the seed shaft intersects with the reference line, a bottom surface of the seed shaft is flush with the lower edge of the heat shield in a horizontal plane, then a second stage is entered, in which the image processing apparatus records a current position of the seed shaft, the seed shaft is continuously lowered by a fixed height, and a seed located at a bottom end of the seed shaft extends into the molten silicon for monocrystal growth;

performing seeding process;

performing shouldering process;

performing body growth; and tailing.

2. The monocrystal growth method of claim 1, wherein in the first stage, the seed shaft gradually descends to a second preset distance from the liquid level of the molten silicon, and when a liquid level temperature of the molten silicon is heated to gradually approach a welding temperature, the seed shaft is lowered again to be flush with the lower edge of the heat shield in a horizontal plane then the second stage is entered, when the liquid level temperature of the molten silicon reaches the welding temperature, the seed shaft is lowered again by a fixed height, and the seed located at the bottom of the seed shaft extends into the molten silicon for monocrystal growth.

3. The monocrystal growth method of claim 2, wherein the second preset distance is in a range of 350 mm to 450 mm.

4. The monocrystal growth method of claim 1, wherein in the first stage, the seed shaft descends from an initial position to a third preset distance from the liquid level of the molten silicon and maintains for a first time interval, then the seed shaft descends to a fourth preset distance from the liquid level of the molten silicon and maintains for a second time interval, and finally the seed shaft descends to a second preset distance from the liquid level of the molten silicon and maintains for a third time interval.

5. The monocrystal growth method of claim 4, wherein the third preset distance is in a range of 1300 mm to 1700 mm.

6. The monocrystal growth method of claim 4, wherein the fourth preset distance is in a range of 500 mm to 900 mm.

7. The monocrystal growth method of claim 1, wherein the fixed height is equal to a sum of the first preset distance and a length of a lower portion of the seed shaft.

8. The monocrystal growth method of claim 1, wherein the first direction is perpendicular to the second direction.

9. The monocrystal growth method of claim 1, wherein an axis direction of the seed shaft coincides with an axis direction of the heat shield.

10. The monocrystal growth method of claim 1, further comprising:

determining whether the silicon material is fully molten in the crucible by the camera and the image processing apparatus.

* * * * *